United States Patent
Lange

(10) Patent No.: US 7,074,653 B2
(45) Date of Patent: Jul. 11, 2006

(54) HEATSINK APPARATUS AND THERMALLY-CONDUCTIVE INTERMEDIATE MATERIAL FOR DISSIPATING HEAT IN SEMICONDUCTOR PACKAGES

(75) Inventor: Bernhard P. Lange, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/923,920

(22) Filed: Aug. 23, 2004

(65) Prior Publication Data

US 2006/0038282 A1    Feb. 23, 2006

(51) Int. Cl.
*H01L 21/44* (2006.01)
(52) U.S. Cl. .......................... 438/122; 257/796
(58) Field of Classification Search ........ 438/122–127; 257/675, 706, 723, 796
See application file for complete search history.

(56) References Cited

U.S. PATENT DOCUMENTS

| | | | |
|---|---|---|---|
| 5,533,256 A | * | 7/1996 | Call et al. ............ 29/840 |
| 6,326,678 B1 | * | 12/2001 | Karnezos et al. ...... 257/666 |
| 6,918,178 B1 | * | 7/2005 | Chao et al. ........... 29/841 |

* cited by examiner

*Primary Examiner*—David Nelms
*Assistant Examiner*—Quoc Hoang
(74) *Attorney, Agent, or Firm*—Yingsheng Tung; Wade James Brady, III; Frederick J. Telecky, Jr.

(57) ABSTRACT

A semiconductor package comprising a die adjacent a lead frame die pad, said lead frame die pad adapted to dissipate heat from the die. The package further comprises a thermally-conductive material abutting the die and a heatsink abutting the thermally-conductive material, said heatsink facing a direction opposite from the lead frame die pad.

5 Claims, 4 Drawing Sheets

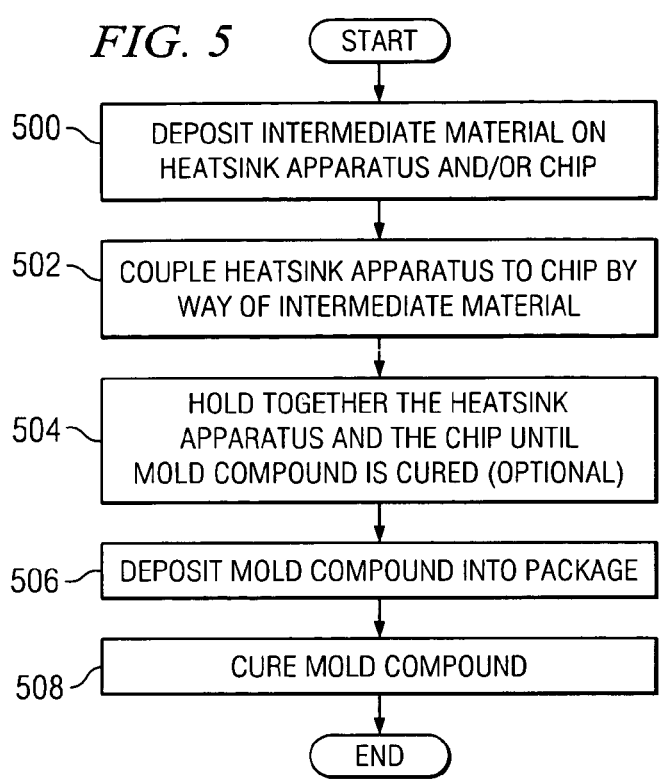
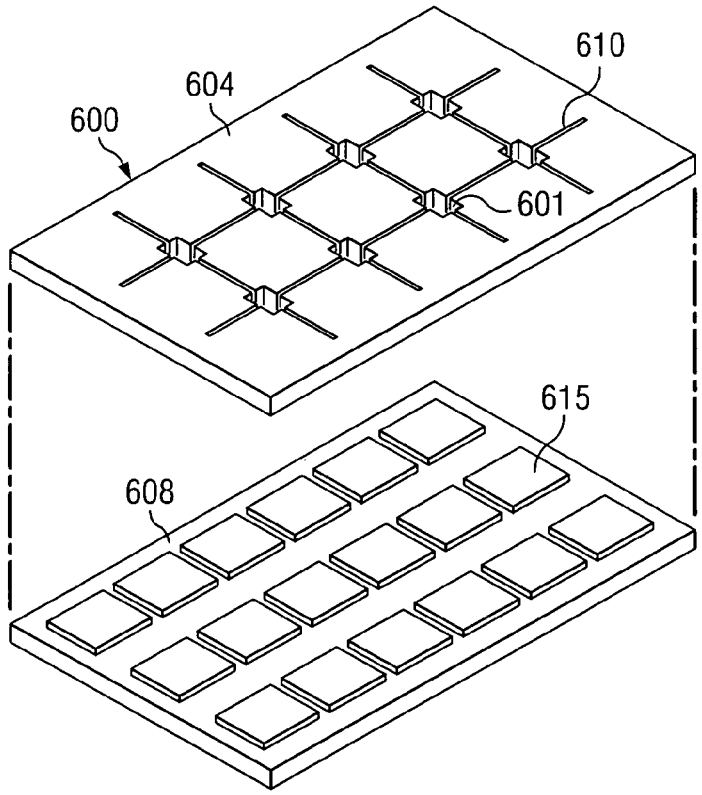

HEATSINK APPARATUS AND THERMALLY-CONDUCTIVE INTERMEDIATE MATERIAL FOR DISSIPATING HEAT IN SEMICONDUCTOR PACKAGES

BACKGROUND

Integrated circuits are fabricated on the surface of a semiconductor wafer in layers and later singulated into individual semiconductor devices, or "dies." Since the material of a semiconductor wafer—commonly silicon—tends to be relatively fragile and brittle, dies are often packages in a protecting housing, or "package," before the dies are interconnected with a circuit board. Packages may fall into any of a variety of package categories. Two such categories are exposed-die packages and non-leaded wirebond packages.

FIG. 1 shows a cross-sectional side view of an exposed-die package 100, such as a PowerPad® package or a plastic package. The package 100 comprises a die 102 coupled to a leadframe die pad 104 of a leadframe 106 by way of a die attach material 103 (e.g., epoxy). The die 102 is electrically coupled to the leadframe 106 using bond wires 108. The die 102, the bond wires 108, the die attach material 103 and portions of the leadframe 106 are encapsulated in a mold compound 110. The leadframe 106 comprises a plurality of leads 112 that protrude from the mold compound 110. At least some of the leads 112 may be electrically coupled to a circuit board 114. In this way, electrical signals are transferred between the die 102 and the board 114. Further, at least a portion of the die pad 104 is exposed from a surface 118 of the mold compound 110 and is in contact with the board 314. As such, heat is transferred away from the die 102 and toward the board 114 by way of the die pad 104. Thus, the board 114 acts as a heatsink for the package 100.

FIG. 2 shows a cross-sectional side-view of an exemplary non-leaded wirebond package 200 (e.g., quad-flat no-lead package, small-outline no-lead package). The term "non-leaded" connotes a lack of leads protruding from the package 200, as found in the package 100 of FIG. 1. The package 200 comprises a die 202 coupled to a leadframe die pad 204 of a leadframe 201 by way of a die attach material 203 (e.g., epoxy). The die 202 is electrically coupled to the leadframe 201 using bond wires 208. The die 202, the die attach material 203, the bond wires 208 and portions of the leadframe 201 are encapsulated in a mold compound 210. As previously mentioned, unlike the leaded package 100, the non-leaded package 200 does not comprise any leads. Instead, the die 202 trades electrical signals with a circuit board 214 by way of peripheral portions 216 ("peripherals") of the leadframe 201. The peripherals 216 do not protrude from the mold compound 210 as do the leads 112 from the compound 110; instead, the peripherals 216 are exposed from a surface 218 of the mold compound 210. The die pad 204 also may be exposed from the surface 218. As such, because the die pad 204 is exposed from the surface 218 and is in contact with the board 214, heat is transferred away from the die 202 and to the board 214 by way of the die pad 204. Thus, the board 214 acts as a heatsink for the package 200.

In some cases, circuit boards coupled to such packages (e.g., boards 114 and 214) may have a design flaw or some other limitation that prevents adequate heat dissipation away from the package. In such cases, a device containing the circuit board may overheat and either be destroyed or thrust into a state of thermal shutdown. Some packages may comprise heatsinks coupled to the package mold compound (e.g., mold compounds 210, 310) to help dissipate heat away from the package. However, package mold compounds usually do not have adequate levels of thermal conductivity to compensate for the overheating effect described above.

SUMMARY

The problems noted above are solved in large part by a heatsink apparatus and thermally-conductive intermediate material for dissipating heat in semiconductor packages. One exemplary embodiment may be a semiconductor package comprising a die adjacent a lead frame die pad, said lead frame die pad adapted to dissipate heat from the die. The package further comprises a thermally-conductive material abutting the die and a heatsink abutting the thermally-conductive material, said heatsink facing a direction opposite from the lead frame die pad.

BRIEF DESCRIPTION OF THE DRAWINGS

For a detailed description of exemplary embodiments of the invention, reference will now be made to the accompanying drawings in which:

FIG. 5 shows a flow diagram of a process that may be used to implement the configurations of FIGS. 3 and 4, in accordance with embodiments of the invention;

FIG. 6c shows a matrix from FIG. 6a and/or FIG. 6b coupling to dies still on a semiconductor wafer, in accordance with embodiments of the invention.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention.

Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
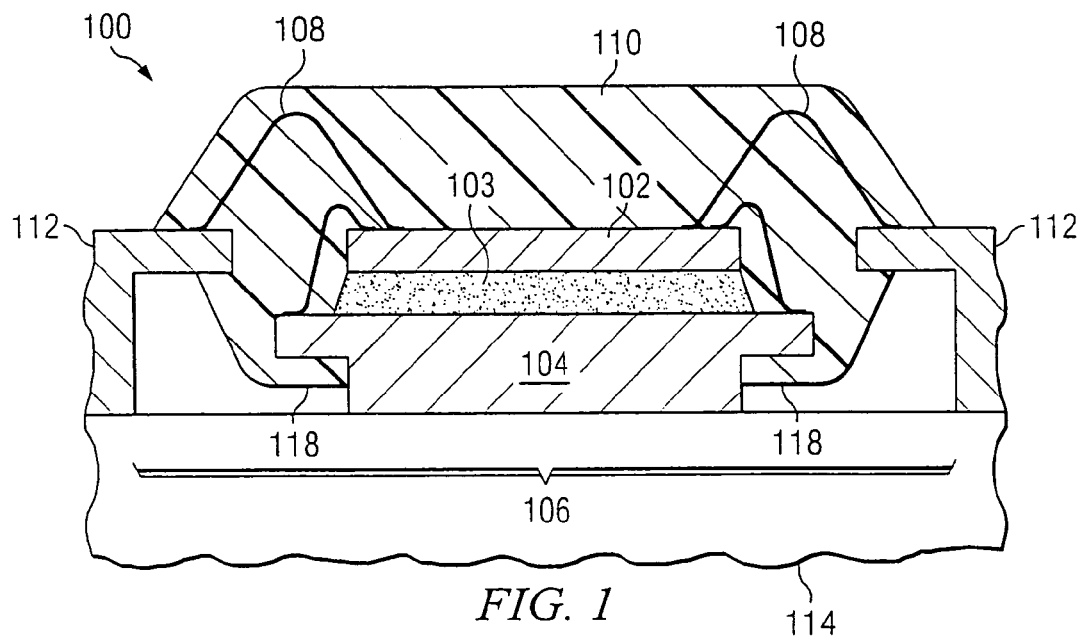
FIG. 1 shows an exposed-die package coupled to a circuit board.
Figure 2:
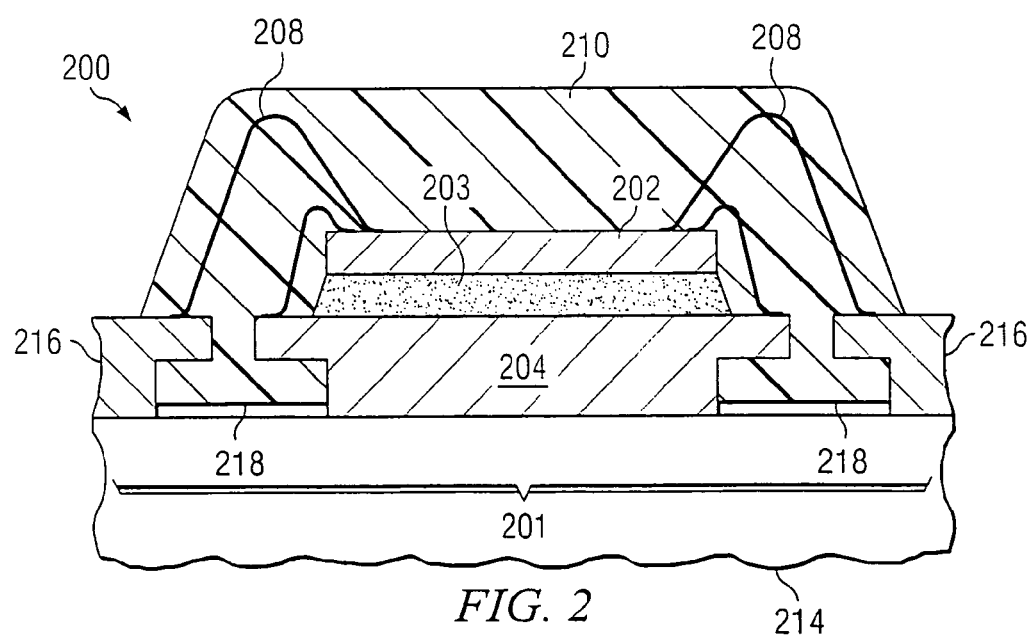
FIG. 2 shows a non-leaded wirebond package coupled to a circuit board.
Figure 3:
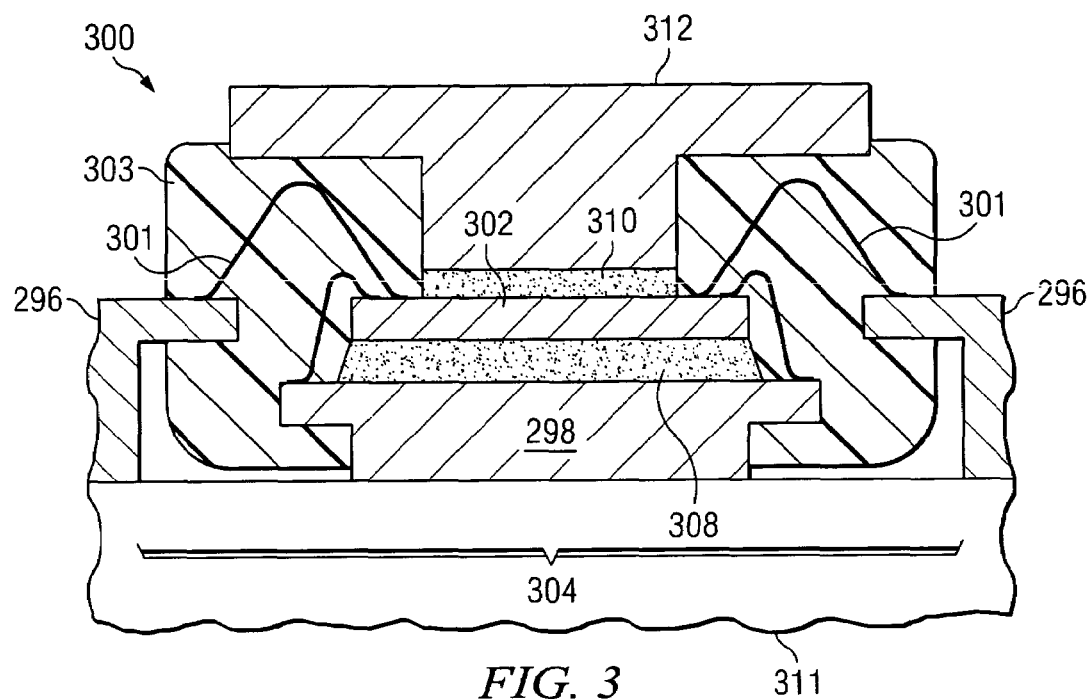
FIG. 3 shows an exposed-die package comprising a heatsink apparatus and intermediate material, in accordance with embodiments of the invention.
Figure 4:
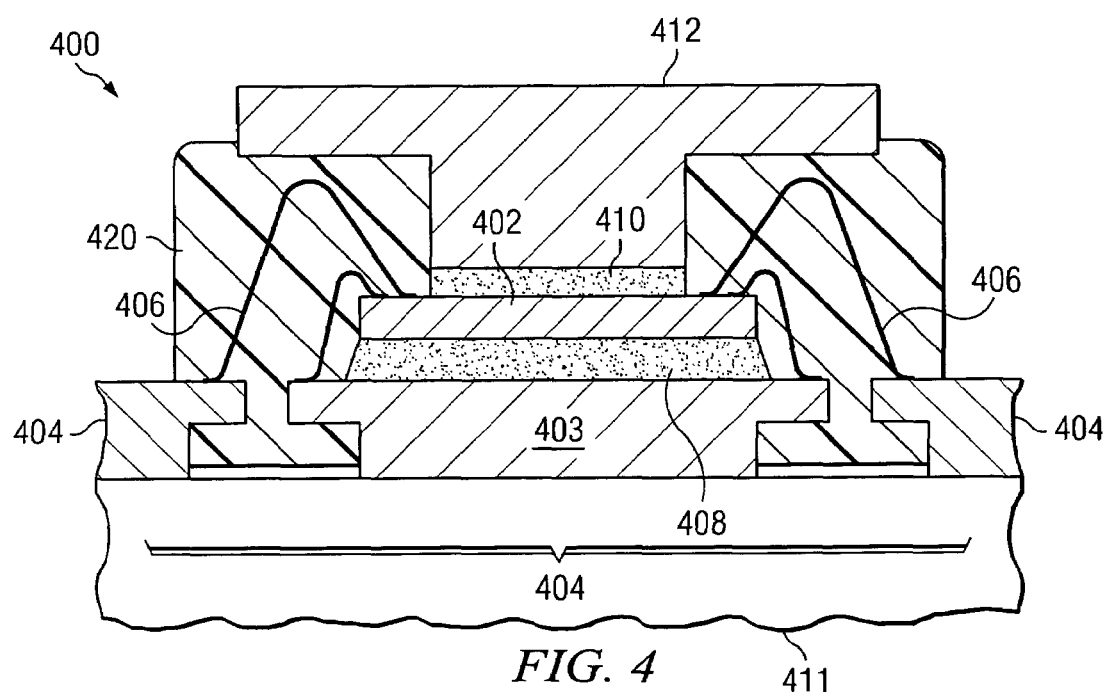
FIG. 4 shows a non-leaded wirebond package comprising a heatsink apparatus and intermediate material, in accordance with embodiments of the invention.

Disclosed herein is a heatsink apparatus that may be incorporated into any of a variety of semiconductor packages to substantially enhance package thermal dissipation. Specifically, a thermally conductive heatsink apparatus is coupled to an interposer or some other intermediate material abutting a die in a package. The intermediate material is used to minimize mechanical stress caused by the die as a result of multiple thermal expansion rates in the die. Because the intermediate material also is thermally conductive, heat is transferred from the die to the heatsink apparatus by way of the intermediate material. In this way, heat is effectively dissipated from the package. FIGS. 3 and 4 show the heatsink apparatus incorporated into an exposed-die package and a non-leaded wirebond package, respectively, although the heatsink apparatus may be used in any type of package (e.g., wirebond, flip-chip) to enhance heat dissipation.

In particular, FIG. 3 shows an exposed die package 300 comprising a chip (i.e., die) 302 electrically coupled to a leadframe 304 by way of bond wires 306. The die 302 is physically coupled to a leadframe die pad 298 of the leadframe 304 by way of a die attach material 308 (e.g., solder, epoxy). The die 302 may be electrically coupled to a circuit board 311 by way of bond wires 301 and leads 296. An intermediate material 310 abuts the die 302 and a heatsink apparatus 312 abuts the intermediate material 310. The intermediate material 310 may be any of a variety of thermally conductive materials, such as an interposer (e.g., adhesive heat conductive tape), a liquid die attach, film die attach, solder alloy, or mold die attach. The heatsink apparatus 312 may be metal (e.g., copper), thermally-conductive plastic or any other suitably thermally conductive material. The die 302, the die attach material 308, the intermediate material 310, and portions of the lead frame 304 and the heatsink apparatus 312 may be encapsulated in and protected by a mold compound 303. Because there exists little thermal resistance between the die 302 and the heatsink apparatus 312 (i.e., the intermediate material 310 is thermally conductive), the heatsink apparatus 312 may prevent a device containing the package 300 and/or the circuit board 311 from overheating, being thrust into thermal shutdown, or otherwise becoming damaged.

FIG. 4 shows yet another exemplary embodiment of the heatsink apparatus described above. Specifically, FIG. 4 shows a non-leaded wirebond package 400 (e.g., a quad-flat no-lead or small-outline no-lead package) comprising a die 402 electrically coupled to a circuit board 411 by way of a leadframe 404 and bond wires 406. The die 402 is physically coupled to a leadframe die pad 403 of the leadframe 404 by way of a die attach material 408 (e.g., epoxy). An intermediate material 410 abuts the die 402 and a heatsink apparatus 412 abuts the intermediate material 410. The intermediate material 410 may be any of a variety of thermally conductive materials, such as an interposer (e.g., adhesive heat conductive tape), a liquid die attach, a film die attach, solder alloy, or a mold die attach. The heatsink apparatus 412 may be a metal (e.g., copper), a thermally-conductive plastic or any other such material. The die 402, the die attach material 408, the intermediate material 410, and portions of the lead frame 404 and the heatsink apparatus 412 may be encapsulated in and protected by a mold compound 420. Because there exists little thermal resistance between the die 402 and the heatsink apparatus 412 (i.e., the intermediate material 410 is thermally conductive), the heatsink apparatus 412 may prevent a device containing the package 400 and the circuit board 411 from overheating, being thrust into thermal shutdown, or otherwise becoming damaged.

A heatsink apparatus may be incorporated into a package using any of a variety of techniques, depending on the intermediate materials used to couple the heatsink apparatus to the package die. FIG. 5 shows one exemplary process that may be used to implement a heatsink apparatus and intermediate material into any type of package. The process may be begun by depositing thermally-conductive material ("intermediate material") onto a suitable surface of a heatsink apparatus and/or a package die (block 500). As mentioned above, the intermediate material may be any suitable, thermally-conductive material, such as liquid die attach, film die attach, an interposer (e.g., adhesive heat conductive tape), or a mold compound, although the scope of disclosure is not limited to these materials. The process then may be continued by coupling the heatsink apparatus to the package die, with the intermediate material sandwiched therebetween (block 502). In this way, heat may be dissipated from the chip to the heatsink by way of the intermediate material. In cases where the intermediate material is a mold compound, the process comprises the optional step of holding together the heatsink apparatus and the die using a vacuum, clamps, or other suitable tool until the mold compound is cured (block 504). The process may further be continued by depositing a mold compound into the package (block 506). The process may be completed by curing the mold compound (block 508). This process may be performed in any order, and one or more steps may be removed.

In many cases, the process of FIG. 5 may be used to couple a heatsink apparatus to a die that has already been singulated from a semiconductor wafer or leadframe strip. However, the process of FIG. 5 also may be used in situations where the dies have not yet been singulated from a semiconductor wafer or leadframe/substrate strip. In these cases, multiple heatsink apparatuses may simultaneously be coupled to multiple package dies (i.e., the process of FIG. 5 may be performed en masse on several dies of a wafer or leadframe/substrate strip). These multiple heatsink apparatuses may be coupled to multiple dies on a wafer or leadframe/substrate strip by arranging the apparatuses in a matrix pattern to match the pattern of the dies on the wafer. Although the scope of disclosure is not limited to any particular pattern, two exemplary patterns are shown in FIGS. 6a and 6b.

Figure 6A:
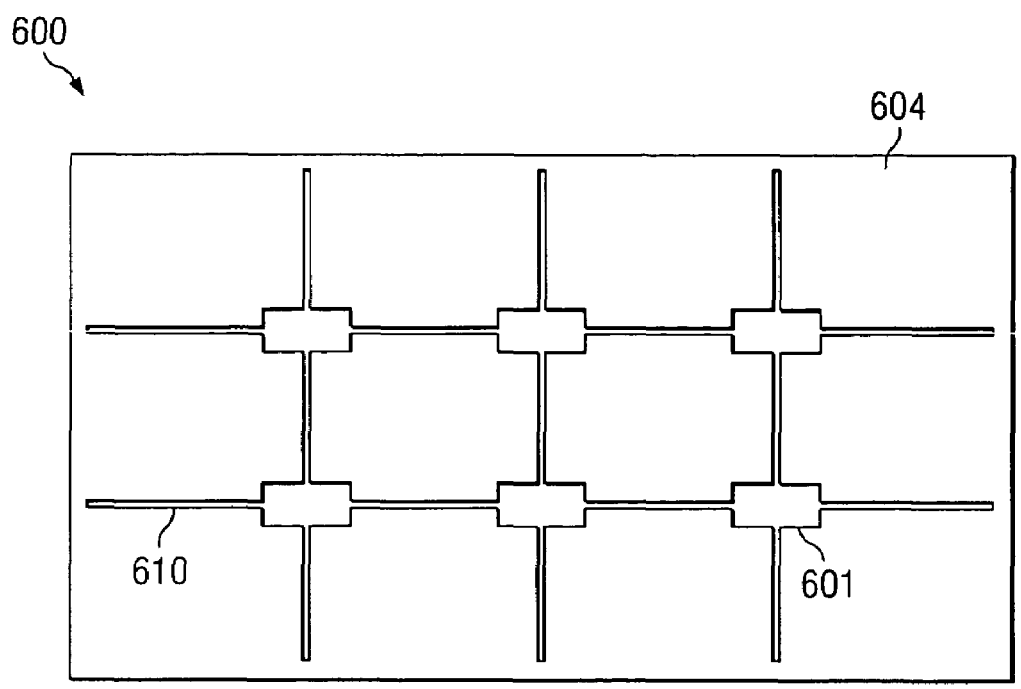
FIGS. 6a and 6b show heatsink apparatus matrices that may be coupled to dies still on a semiconductor wafer, in accordance with embodiments of the invention.
Figure 6B:
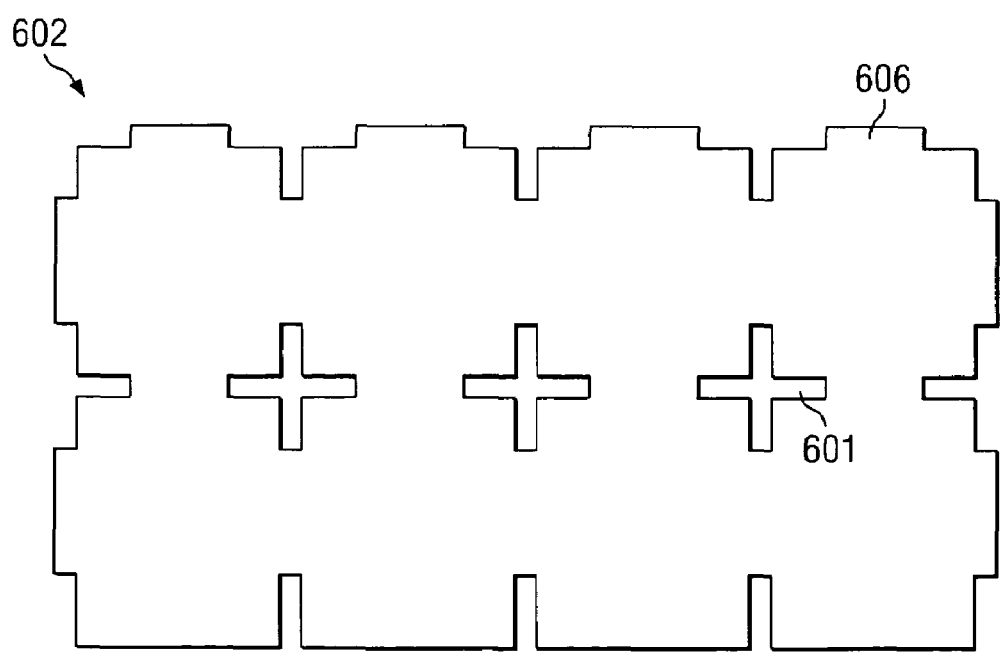

FIGS. 6a and 6b each show a top-down view of a matrix 600, 602 comprising multiple heatsink apparatuses 604, 606, respectively. Each matrix 600, 602 comprises multiple apertures 601 fixed between at least some of the heatsink apparatuses 604, 606. The apertures 601 may be of any shape, such as a substantially rectangular shape or a cross shape. In at least some embodiments, a matrix may comprise singulation lines to aid in die separation, such as singulation lines 610 on the matrix 600. As shown in FIG. 6c, a matrix 600 (or matrix 602) may be coupled to a wafer 608 comprising multiple dies 615. The apparatuses 604 of the matrix 600 may be coupled to the dies 615 of the wafer 608 using the process of FIG. 5. The apertures 601 may be used to deposit a mold compound onto the dies 615. After the mold compound has been cured, the wafer 608 may be singulated such that at least some of the dies 615 are separated from each other.

The above discussion is meant to be illustrative of the principles and various embodiments of the present invention. Numerous variations and modifications will become apparent to those skilled in the art once the above disclosure is fully appreciated. For example, while the above embodiments illustrates the heatsink apparatus incorporated into an exposed-die package and a non-leaded wirebond package, the heatsink apparatus also may be used in any other type of package to enhance heat dissipation. It is intended that the following claims be interpreted to embrace all such variations and modifications.

What is claimed is:

1. A method, comprising:
    depositing a thermally-conductive material on a die adjacent a package lead frame;
    coupling a heatsink to the die on a side of the die opposite said package lead frame, including coupling a heatsink matrix of a plurality of heatsinks with an aperture to a semiconductor wafer having a plurality of dies, the thermally-conductive material sandwiched between the heatsink and the die, said heatsink facing away from the lead frame; and
    depositing a mold compound adjacent the die including depositing the mold compound through the aperture in the matrix.

2. The method of claim 1, in which the heatsink has a has a T shaped cross-section, the bottom of the T couples to top surface and the top of the T overhangs the wire-bonds.

3. The method of 2, in which the top of the heatsink is uncovered by the mold compound.

4. The method of claim 1, further comprising separating the matrix to form individual semiconductor packages.

5. The method of claim 1, in which the heatsink is uncovered by the mold compound.

* * * * *